United States Patent [19]

Omata

[11] Patent Number: 4,906,080
[45] Date of Patent: Mar. 6, 1990

[54] OPTICAL ARRANGEMENT FOR PROJECTION EXPOSURE

[75] Inventor: Takashi Omata, Yokosuka, Japan

[73] Assignee: Canon Kabushiki Kaisha, Tokyo, Japan

[21] Appl. No.: 358,496

[22] Filed: May 30, 1989

Related U.S. Application Data

[63] Continuation of Ser. No. 48,812, May 12, 1987, abandoned.

[30] Foreign Application Priority Data

May 14, 1986 [JP] Japan ................... 61-109979

[51] Int. Cl.⁴ .......................... G02B 13/18; G02B 9/14
[52] U.S. Cl. ...................................... 350/432; 350/448; 350/475
[58] Field of Search .................. 350/432, 448–450, 350/433, 434, 435, 475

[56] References Cited

U.S. PATENT DOCUMENTS 4,637,691 1/1987 Uehara et al. .................. 350/432
4,682,885 7/1987 Torigoe .......................... 350/433 X

FOREIGN PATENT DOCUMENTS

3710291 8/1962 Japan .

Primary Examiner—Scott J. Sugarman
Attorney, Agent, or Firm—Fitzpatrick, Cella, Harper & Scinto

[57] ABSTRACT

An optical arrangement for projection exposure includes an illuminating system adapted to supply an illumination light usable for illuminating an original, an imaging system effective to form an image of the original on a predetermined image plane, and an optical element operable so that an angle of inclination of a chief ray of the illumination light, with respect to an optical axis of the imaging system, and an angle of inclination, with respect to said optical axis, of a chief ray defined by the imaging system and lying on a light-entrance side of the imaging system, are made substantially equal to each other.

11 Claims, 3 Drawing Sheets

OPTICAL ARRANGEMENT FOR PROJECTION EXPOSURE

This application is a continuation of application Ser. No. 048,812, filed May 12, 1987, now abandoned.

FIELD OF THE INVENTION AND RELATED ART

This invention relates to an optical arrangement for projection exposure, usable in optically projecting or photolithographically transferring, upon or onto a surface of a workpiece such as a semiconductor wafer, an image of a fine pattern such as a microcircuit pattern which is formed on an original such as a mask or reticle (hereinafter simply "mask"). More particularly, the invention is concerned with an optical arrangement for projection exposure, suitably usable in a projection exposure apparatus of the type that requires use of a combination of an illumination optical system for illuminating the surface of a mask and a projection optical system for projecting an image of the mask upon the surface of a photosensitive material. Typically, the optical arrangement of the present invention is suitably applicable to an optical system in a step-and-repeat type projection exposure apparatus adapted to photoprint images of a circuit pattern on different zones (shot areas) of a wafer in sequence.

The recent trend toward further miniaturization of semiconductor devices has forced developments in the device manufacturing technique, more particularly the lithographic technique assuring formation of high-density circuit patterns.

Usually, a circuit pattern provided on a mask is illuminated by an illumination optical system which includes a light source such as a super Hg lamp and a plurality of condenser lens groups. A projection optical system is used to project the circuit pattern of the mask upon the surface of a wafer having a photosensitive surface layer, called a "photoresist layer" or "resist layer", whereby the circuit pattern is photoprinted on the wafer.

Figures 1, 2, 3:
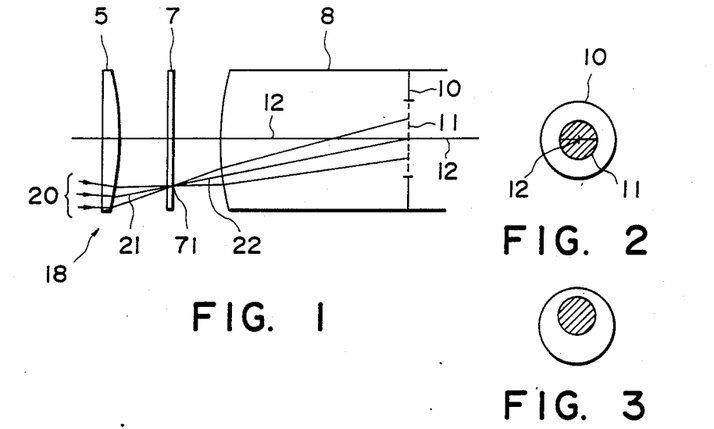
FIG. 1 is a explanatory view for showing inconveniences involved in a known type optical arrangement for projection exposure, and schematically shows a portion of a condenser lens system of an illumination optical system and a portion of a projection optical system.
FIG. 2 is a schematic view, illustrating the coincidence of the center of an image of a light source with the center of a stop provided in a projection optical system.
FIG. 3 is a schematic view, illustrating the lack of coincidence between the center of an image of a light source and the center of a stop provided in a projection optical system, the light source image formed in the plane of the stop being deviated in a direction perpendicular to an optical axis of the projection optical system.

FIG. 1 of the accompanying drawings is an explanatory view showing a portion of a condenser lens system included in a known type illumination optical system, denoted at 18, and a portion of a known type projection optical system denoted at 8. In the optical arrangement of FIG. 1, a light flux 20 emitted from a light source (not shown) and illuminating a portion 71 of a mask 7 forms an image of the light source at a position close to a stop 10 which is provided in the projection optical system 10. The thus formed image is denoted at numeral 11.

In conventional optical arrangements used in projection type exposure apparatuses, as is illustrated in FIG. 1, a chief ray 22 of the imaging light which ray is on a light entrance side of the projection optical system 8 (i.e. a ray portion lying between the mask 7 and the first refracting surface of the projection optical system 8) and which is going to pass through a center of the stop 10 has an angle of inclination, with respect to an optical axis 12, that is not exactly equal to an angle of inclination defined, with respect to the optical axis 12, by a chief ray 21 of the mark illuminating light which ray is on a light exit side of the illumination optical system 18 (i.e. a ray portion lying between the final refracting surface of the illumination optical system 18 and the mask 7) and which has passed through a center of a stop of the illumination optical system 18 or a center of a secondary light source (an image of the light source), although such slight difference in the inclination angle is not clearly illustrated in FIG. 1.

In this Specification, hereinafter, the term "angle of inclination of a chief ray" will be used to refer to the angle of inclination, with respect to the optical axis, of such portion of the chief ray 21 or 22 as parenthetically noted above.

The difference in such inclination angle results in the failure of forming the image 11 of the light source so that the center of the light source image exactly coincides with the center of the stop 10, as illustrated in FIG. 2. Namely, with the conventional optical arrangement, the light source image 11 is formed at a position deviated or shifted from the center of the stop 10 as illustrated in FIG. 3.

Such incoincidence of the center of the light source image 11 with the center of the stop 10, that is, the difference in the inclination angle with respect to the optical axis between the chief rays 21 and 22 of the illumination optical system 18 and the projection optical system 8, may be result from the following factors:

One may be aberrations caused by the illumination optical system 18. Another factor may be aberrations remaining in the projection optical system 8 and, more particularly, aberrations which might be caused with reference to the "imaging" in relation to a pupil of the projection optical system.

Figure 4:
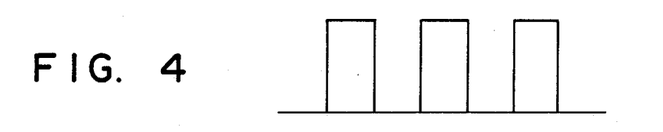
FIG. 4 is a schematic illustration of a light-transmissive or light-reflective intensity distribution of a pattern provided on a mask.
Figure 5:
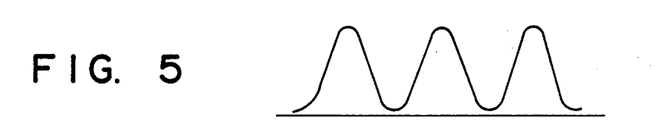
FIG. 5 is a schematic illustration of an intensity distribution of an image formed on a photosensitive surface as a result of pattern projection by use of an optical arrangement that satisfies the relation shown in FIG. 2 with respect to the formation of the light source image.
Figure 6:
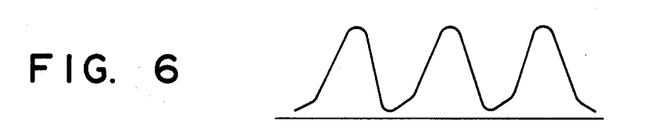
FIG. 6 is a schematic illustration of an intensity distribution of an image formed on a photosensitive surface as a result of pattern projection by use of an optical arrangement that satisfies the relation shown in FIG. 3 with respect to the formation of the light source image.

The formation of the light source image 11 at a deviated position with respect to a predetermined position defined for the stop 10, as described hereinbefore, leads to the following inconveniences:

Where a circuit pattern provided on the mask surface has a light-transmissive or light-reflective intensity distribution, such as e.g. schematically illustrated in FIG. 4, and when such pattern is to be projected by a projection optical system upon a photosensitive surface which is the wafer surface, there will be formed on the photosensitive surface an image having an intensity distribution pattern such as illustrated in FIG. 5 that corresponds to the intensity distribution of the mask pattern, on condition that the above-described deviation of the light source image is avoided. In the intensity distribution shown in FIG. 5, each intensity peak has a substantially symmetrical configuration as illustrated. If, on the other hand, the deviation of the light source image occurs, the image of the mask pattern formed on the photosensitive surface as a result of the projection will have an intensity distribution pattern such as, for example, illustrated in FIG. 6 wherein each intensity peak has an asymmetrically deformed configuration. If the resist patterning or photoprinting is executed with use of the mask pattern image having such an asymmetrical intensity distribution, then the photosensitive or photoresist material on the wafer surface will have, after an etching process, an asymmetrical profile in section. If this occurs, the resolution in the pattern printing deteriorates disadvantageously.

SUMMARY OF THE INVENTION

It is accordingly a primary object of the present invention to provide an optical arrangement for projection exposure, by which the above-described problems are fully solved and by which superior pattern 25 projection is made attainable, over the whole of the range of projection of a projection optical system, such that an image of a pattern can be formed by the projection with high resolution.

Briefly, in accordance with one aspect of the present invention, to achieve the above object, there is provided an optical arrangement for projection exposure, comprising:

illuminating means adapted to supply an illumination light usable for illuminating an original;

imaging means effective to form an image of the original on a predetermined image plane; and optical means operable so that an angle of inclination of a chief ray of the illumination light, with respect to an optical axis of said imaging means, and an angle of inclination, with respect to said optical axis, of a chief ray defined by said imaging means and lying on a light-entrance side of said imaging means are made substantially equal to each other.

According to another aspect of the present invention, there is provided an optical arrangement for projection exposure, comprising:

illuminating means for supplying an illumination light usable for illuminating an original;

imaging means for forming an image of the original on a predetermined image plane, said imaging means having a stop provided at a position at which an image of a light source is formed; and optical means operable so that a center of the image of the light source is substantially coincident with a center of said stop of said imaging means.

The optical arrangement according to one preferred form of the present invention includes an illumination optical system having a plurality of lens components, for illuminating an original by use of an illumination light and a projection optical system for projecting an image of the original upon a predetermined image plane. At least one refracting surface of at least one of the plural lens components is made aspherical and, by the optical action of such aspherical surface, the angle of inclination, with respect to an optical axis of the projection optical system, of a chief ray of the illumination light incident upon the original is made coincident with the angle of inclination, with respect to the optical axis, of a chief ray of a light (imaging light to be projected) on a light entrance side of the projection optical system.

The original described above may be a mask or a reticle usable in semiconductor device manufacturing exposure apparatuses. In such type of exposure apparatuses, a semiconductor wafer is placed in the aforementioned predetermined image plane.

As for a light source providing the illumination light, a super Hg lamp or a laser source such as an excimer laser source may be used.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 7:
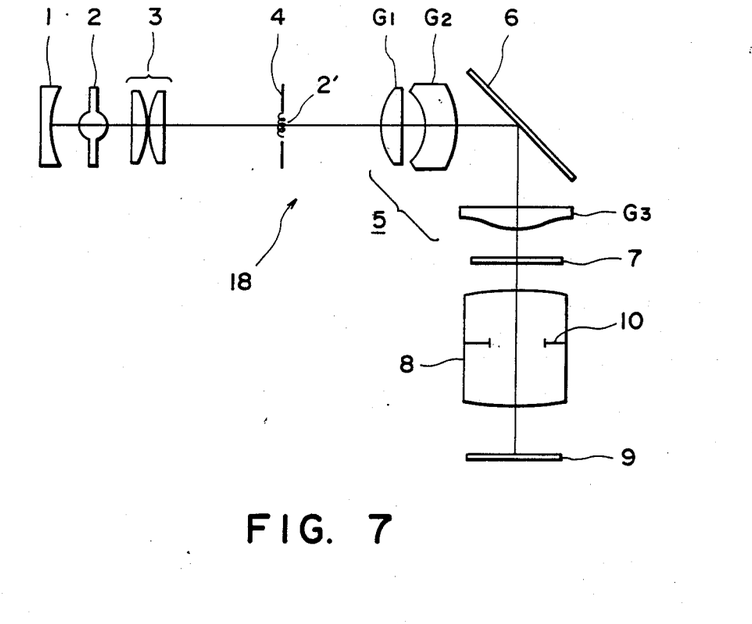
FIG. 7 is a schematic view of an optical arrangement for projection exposure, according to one embodiment of the present invention.

Referring now to FIG. 7, there is shown an optical arrangement for projection exposure, according to one preferred form of the present invention.

As shown in FIG. 7, the optical arrangement of the present embodiment includes a light source 2 such as a super Hg lamp; a spherical mirror 1 whose center of curvature is disposed at the light source 2 position so as to effectively utilize the light from the light source 2; a first condenser lens system 3 effective to form an image of the light source 2, the image being operable as a secondary light source; a stop 4 which is disposed in the neighborhood of the imaging position of the image 2' (secondary light source) formed by the first condenser lens system 3, the stop 4 being effective to extract an effective or desired portion out of the light forming the image 2'; a second condenser lens system 5 for uniformly illuminating a surface of a mask 7 by use of the light from the secondary light source (image 2') formed in the neighborhood of the stop 4, the second condenser lens system 5 including at least one aspherical surface; a flat mirror 6 for bending or deflecting the light; and a projection optical system 8 for projecting, with a high resolving power, an image of an original such as a mask 7, having formed thereon a fine circuit pattern, upon a workpiece such as a wafer 10 having its surface coated with a photosensitive material (photoresist layer). Denoted at 10 is a stop provided in the projection optical system 8. The optical elements denoted by reference numerals 1–5 cooperate with each other to provide an illumination optical system which is generally denoted at 18.

In the optical arrangement according to the present embodiment, the image 2' of the light source 2, operable as a secondary light source, is formed in the neighborhood of the stop 4 position by means of the first condenser lens system 3. By controlling the shape of the stop 4, only a desired portion of the light forming the secondary light source (image 2') is allowed to pass through the stop. Then, by means of the second condenser lens system 5, the mask 7 surface is uniformly illuminated with the light from the secondary light source (image 2'). The projection optical system 8 is effective to project the circuit pattern, provided on the mask 7 surface, upon the wafer surface which is in an optically conjugate relation with the mask 7 surface.

The optically conjugate relation defined in the optical arrangement of FIG. 7 will now be described in detail.

The first condenser lens system 3 is operable to form an image of the light source 2 at the stop 4 position as a secondary light source denoted by numeral 2'. Thus, the light source 2 and the restricting plane of the stop 4 are in an optically conjugate relation. The image 2' of the light source 2, formed in the restricting plane of the stop 4, functions as a secondary light source of the illumination optical system 18.

Also, the stop 4 of the illumination optical system 18 and the stop 10 of the projection optical system 8 are in an optically conjugate relation by way of the second condenser lens system 5, the flat mirror and a portion of the projection optical system 8. Namely, an image of the secondary light source 2' is formed in the plane of the stop 10. As a result, the stop 10 is also in an optically conjugate relation with the light source 2. Further, the illumination light supplied from the second condenser lens system 5 is effective to illuminate the mask 7 in a "Kohler illumination" fashion.

Since the stop 10 of the projection optical system 8 is optically equivalent to an entrance pupil of the projection optical system 8, it can be stated that an image of the light source is formed on a plane of the entrance pupil of the projection optical system 8. Hereinafter, such light source image as formed thereon will be referred to also as an "effective light source image".

Since, on the other hand, the light source image is formed at the entrance pupil of the projection optical system 8, the imaging light (image forming light) supplied from the projection optical system 8 is effective to illuminate the wafer 9 in the "Kohler illumination" fashion.

As described hereinbefore, the mask 7 and the wafer 9 are illuminated each in the "Kohler illumination" fashion by the illumination light and the imaging light, respectively. As a result, each of the mask 7 and the wafer 9 can be illuminated with a uniform intensity distribution. This is very desirable.

Further, in the optical arrangement according to the present invention, at least one refracting surface of at least one lens element of the second condenser lens system 5 is provided by an aspherical surface and, by doing so, for each position on the mask surface (i.e. for each object height), the angle of inclination, with respect to the optical axis, of a chief ray on the light-entrance side of the projection optical system 8 (see FIG. 1) can be substantially equal to the angle of inclination, with respect to the same optical axis, of a chief ray of the illumination light from the illumination optical system 18. By avoiding mutual angular difference between these chief rays, it is made possible to assure optimum-state projection of the circuit pattern of the mask 7 upon the wafer 9 surface thereby to ensure improved resolution of the pattern being projected.

More specifically, according to the present embodiment, the inclination angles of the chief rays of both the projection optical system 8 and the illumination optical system 18 are made substantially equal to each other, over every image height (on the wafer surface) or every object height (on the mask surface) and, by doing so, the above-described shift of the light source image can be avoided. In other words, each chief ray of the projection optical system can exactly pass through the center of the light source image formed at the stop 10. Thus, good patterning or photoprinting is made attainable.

Figure 8:
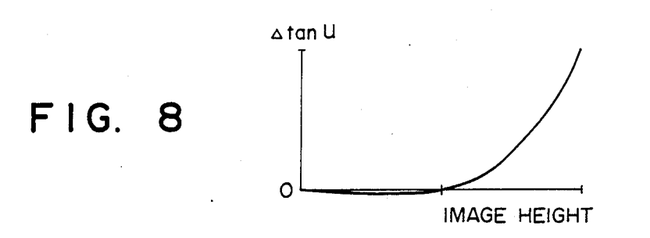
FIG. 8 is a graph related to the difference between the angle of inclination of a chief ray through a projection optical system, lying on its light entrance side, and the angle of inclination of an ideal chief ray that passes exactly through the center of an entrance pupil of the projection optical system, the angular difference being plotted with respect to a varying image height.

In most projection optical systems of the ordinary type, the manner of change, with the changing image height, of the angle of inclination of its chief ray with respect to the optical axis may be such as depicted in FIG. 8, wherein the ordinate denotes the angular difference ($\Delta\tan u$) between the chief ray of the projection optical system, passing through the center of the stop, and an ideal chief ray passing through the center of the entrance pupil, while the abscissa denotes the image height.

Figure 9:
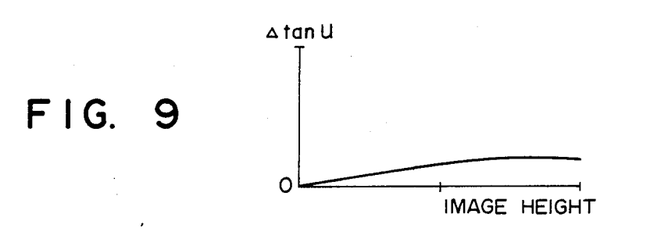
FIG. 9 is a graph related to the difference between the angle of inclination of a chief ray of a prior art illumination optical system exit and the angle of inclination of an ideal chief ray that passes through the center of an entrance pupil of a projection optical system, the angular difference being plotted with respect to a varying image height.

Similarly, the manner of change, with the changing image height, of the angle of inclination of the chief ray of prior art illumination optical systems may be such as depicted in FIG. 9. From these Figures, it is seen that the inclination angles of these chief rays at each image height are not coordinated with each other, with the result that there occurs a shift of the light source image such as described hereinbefore and illustrated in FIG. 3.

In accordance with the present embodiment, as compared therewith, at least one lens surface of a portion of the second condenser lens system 5 of the illumination optical system 18 is provided by an aspherical surface, thereby to make it easy to equalize the inclination angles of the two chief rays.

Figure 10:
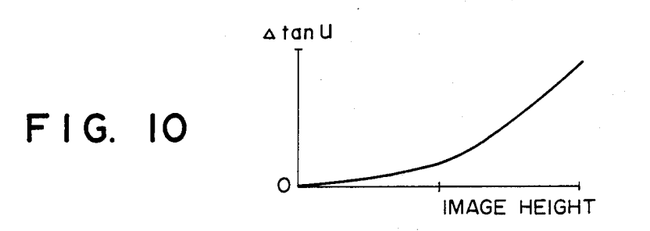
FIG. 10 is a graph related to the difference between the angle of inclination of a chief ray of an illumination optical system arranged in accordance with the present invention and the angle of inclination of an ideal chief ray that passes through the center of an entrance pupil of a projection optical system, the angular difference being plotted with respect to a varying image height.

FIG. 10 shows an example wherein the angle of inclination of the chief ray of the illumination optical system 18 (FIG. 7) is made substantially equal to the angle of inclination of the chief ray of the projection optical system 8, the arrangement being made in accordance with a numerical example of the present invention which will be described later.

According to the present embodiment, as will be seen from FIG. 10, any shift or deviation of the light source image at each image height can be satisfactorily corrected or prevented, the correction or prevention being assured by forming at least one lens surface of a portion of the second condenser lens system 5 by use of an aspherical surface.

In the graphs of FIGS. 8-10, the angular difference (Δtan u) is plotted with respect to the image height. However, even if such angular difference is plotted with respect to an object height, a similar tendency will appear in the variation of the angular difference. In FIGS. 8-10, the image height is used as a scale, only for convenience.

As shown in FIG. 8, the angular difference Δtan u increases with the increasing image height. Therefore, with the enlargement of an exposure area (the range being illuminated) to be defined on the wafer 9 surface, there occurs an increasing degree of lack of coincidence between the inclination angles of the two chief rays of the illumination optical system and the projection optical system such as seen in FIGS. 8 and 9. In view of this, the present invention is quite effectively applicable to an optical arrangement for projection exposure, having a wide exposure range.

In a case, such as depicted in FIGS. 8 and 9, where the inclination angle of the chief ray of the projection optical system is smaller than the inclination angle of the chief ray of the illumination optical system, it is necessary to reduce, with the increase in the image height, the inclination angle of the chief ray of the illumination optical system, such as illustrated in FIG. 10. In view of this, according to the present embodiment, the aspherical shape of the aforesaid at least one aspherical lens element is so shaped that the refracting power is reduced from a lens portion close to the optical axis toward a peripheral lens portion.

When the inclination angle of the chief ray of the illumination light with respect to the optical axis is adjusted by use of an aspherical lens surface, in the present embodiment, there may be caused undesirable aberration. More particularly, there is a possibility that the control of the action of the chief ray of the illumination light causes distortion, which may result in the failure of uniform illumination of the mask 7.

In order to alleviate the effect of distortion, in the present embodiment, the aspherical lens element is preferably provided in the second condenser lens system 5 at a position closest to the mask 7 surface. Namely, it is preferable to provide a lens element, which is to be opposed to the mask 7 that is the object to be illuminated, by an aspherical lens element. More preferably, the aspherical surface may be formed on the surface of such lens element that faces the mask 7 surface.

By doing so, the present embodiment allows suitable control of the inclination angle of the chief ray at each image height.

In the numerical example of the structure of the second condenser lens system 5, which will be shown below, a lens element denoted by reference character G3, that is closest to the mask 7 position, is provided as the aspherical lens element.

In the following, one numerical example will be shown. In this example, the second condenser lens system 5 is formed by three lens components G1, G2 and G3 such as illustrated in FIG. 7. In the numerical example, denoted by Ri is the radius of curvature of the "i-th" lens surface in the order from the light source side; by Di, the thickness or air-spacing of the "i-th" lens element in the order from the light source side; by Ni, the refractive index of the glass constituting the "i-th" lens element in the order from the light source side; and by νi, the Abbe's number of the glass material constituting the "i-th" lens element in the order from the light source side.

As regards the aspherical shape, where the direction of the optical axis is take as an X-axis; where the direction perpendicular to the optical axis is taken as an H-axis; where the direction of advancement of light is taken as being "positive"; where the paraxial curvature radius is denoted by R; and where the aspherical coefficient is denoted by B; then the aspherical shape can be expressed by the following equation:

$$X = \{(1/R)H^2\}/\{1 + \sqrt{1 - (H/R)^2}\} + BH^4$$

Numerical Example

| | | |
|---|---|---|
| R1 = 29.0 | D1 = 15.0 | N1 = 1.4669  ν1 = 67.9 |
| R2 = ∞ | D2 = 13.0 | |
| R3 = −28.0 | D3 = 5.0 | N2 = 1.4669  ν2 = 67.9 |
| R4 = −368.2 | D4 = 150.8 | |
| R5 = ∞ | D5 = 14.0 | N3 = 1.52621  ν3 = 64.1 |
| R6 = aspherical | | |

Aspherical Coefficient
R = −110.0
B = 7 × 10$^{-7}$

Figure 11:
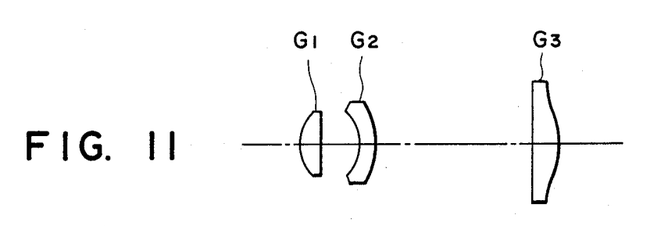
FIG. 11 is a schematic section showing a lens system arranged in accordance with one preferred form of the present invention, details of the lens system being described in the Specification as a numerical example.

FIG. 11 shows, in a schematic view, the structure of the second condenser lens system which is arranged in accordance with the numerical example set forth above.

While, in the FIG. 11 example, one lens surface of the second condenser lens system 5 is provided by an aspherical surface, two or more lens surfaces may be formed by aspherical surfaces. This is preferable because, with such arrangement, the objects of the present invention can be more suitably achieved.

In the embodiment shown in FIG. 7, the light source 2 may be disposed at the stop 4 position. In such case, use of the spherical mirror 1, the first condenser lens system 3 and the stop 4 is not necessary.

The provision of the spherical mirror 1, the first condenser lens system 3 and the stop 4 is not always necessary. They may be replaced by another type of optical system having a similar function. For example, as in an illumination device disclosed in U.S. Pat. Nos. 4,497,013 and 4,497,015, an optical system of the type including an optical integrator may be used. In such case, the optical integrator may be set so that its light-emitting surface is disposed at the stop 4 position. Alternatively, the optical integrator may be disposed so that a secondary light source (image of the primary light source) is formed by the integrator at the position of the stop 4.

Further, the present invention is similarly applicable to a case where, as in an illumination device of the type disclosed Japanese Laid-Open Patent Application, Laid-Open No. 226317/1984, a mask is illuminated by use of a laser beam emitted from a laser source such as an excimer laser. In such case, the system may be arranged so that, at the position of the stop 4, a spot of the laser beam is scanningly deflected.

In one embodiment of the present invention, having been described with reference to FIG. 7, the angle of inclination of the chief ray of the illumination light from the illumination optical system 18 is adjusted by means of an aspherical-surface lens element in order that it is coordinated with or made substantially equal to the angle of inclination of the chief ray of the projection optical system 8, lying on the light-entrance side. However, for the same purpose, the projection optical system 8 may be arranged so as to adjust the inclination angle of the chief ray of the projection optical system, lying on the light-entrance side. In such case, as in the above-described embodiment, one or more aspherical lens elements may be used in the projection optical system 8.

In accordance with the present invention, as has hitherto been described, specific means is provided to make, substantially equal to each other, the angle of inclination of the illumination light from the illumination optical system with respect to the optical axis and the angle of inclination, with respect to the same optical axis, of the chief ray of the projection optical system, lying on the light-entrance side. By this, any shift or positional deviation of the light source image in the plane of the stop of the projection optical system can be effectively avoided. This makes it possible to provide a projection exposure apparatus having a good resolving power over the entire projection field or range.

While the invention has been described with reference to the structures disclosed herein, it is not confined to the details set forth and this application is intended to cover such modifications or changes as may come within the purposes of the improvements or the scope of the following claims.

What is claimed is:

1. An optical arrangement for use in a semiconductor device manufacturing projection exposure apparatus having a projection optical system for projecting a mask pattern upon a semiconductor wafer, said optical arrangement comprising:
   a light source for producing light;
   means for forming a secondary light source at a position optically conjugate with an entrance pupil of the projection optical system by using light from said light source; and
   a lens system for receiving light from said secondary light source and for illuminating the mask pattern with the light, said lens system including an aspherical lens having an aspherical surface the shape of which is determined so that an angle of inclination of a chief ray of the light incident on a point on the mask pattern coincides with an angle of inclination of a chief ray of an imaging light emanating from said point on the mask pattern, the angles of inclination being defined with respect to the projection optical system.

2. An optical arrangement according to claim 1, wherein said aspherical lens is disposed close to the mask pattern.

3. An optical arrangement according to claim 2, wherein said aspherical surface of said aspherical lens is formed on one side of said aspherical lens facing the mask pattern.

4. An optical arrangement according to claim 1, wherein said forming means comprises an optical integrator.

5. An optical arrangement according to claim 4, wherein said light source comprises an excimer laser.

6. An optical arrangement according to claim 4, wherein said light source comprises a super pressure Hg lamp.

7. An optical arrangement according to claim 4, wherein said aspherical lens is disposed close to the mask pattern.

8. An optical arrangement according to claim 7, wherein said aspherical surface of said aspherical lens is formed on one side of said aspherical lens facing the mask pattern.

9. An optical arrangement according to claim 7, wherein said aspherical surface is so formed that it provides a decreasing refracting power, decreasing from a central part close to an optical axis of said aspherical lens to a peripheral part of said aspherical lens.

10. An optical arrangement according to claim 1, further comprising a stop and wherein said secondary light source is formed adjacent to said stop.

11. An optical arrangement according to claim 1, wherein said aspherical lens is effective to provide a corrective action to distortion.

* * * * *

UNITED STATES PATENT AND TRADEMARK OFFICE
CERTIFICATE OF CORRECTION

PATENT NO. : 4,906,080
DATED : March 6, 1990
INVENTOR(S) : Takashi Omata It is certified that error appears in the above-identified patent and that said Letters Patent is hereby corrected as shown below:

ON THE COVER PAGE

IN THE FOREIGN PATENT DOCUMENTS

"3710291 8/1962 Japan" should read --37-10291 8/1962 Japan--.

IN THE DISCLOSURE

COLUMN 2

Line 23, "be" should be deleted; and
Line 66, "pattern 25" should read --pattern--.

COLUMN 3

Line 61, "a" should read --an--.

UNITED STATES PATENT AND TRADEMARK OFFICE
CERTIFICATE OF CORRECTION

PATENT NO. : 4,906,080
DATED : March 6, 1990
INVENTOR(S) : Takashi Omata

It is certified that error appears in the above-identified patent and that said Letters Patent is hereby corrected as shown below:

COLUMN 5

Line 29, "wafer" should read --wafer 9--; and
Line 45, "flat mirror" should read --flat mirror 6--.

COLUMN 6

Line 8, "mask" should read --mask 7--.

Signed and Sealed this

Seventh Day of July, 1992

Attest:

DOUGLAS B. COMER

Attesting Officer

Acting Commissioner of Patents and Trademarks